(12) United States Patent
Cotten et al.

(10) Patent No.: US 6,719,199 B1
(45) Date of Patent: Apr. 13, 2004

(54) CREDIT CARD/SMART CARD TEST DEVICE

(75) Inventors: R. Kenneth Cotten, Raleigh, NC (US); Robert J. Heider, Durham, NC (US); Herbert G. Leonard, Louisburg, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/426,126

(22) Filed: Apr. 29, 2003

(51) Int. Cl.$^7$ .............................. G06F 17/00; G06K 5/00
(52) U.S. Cl. ........................................ 235/380; 235/375
(58) Field of Search .................................. 235/375, 380

(56) References Cited

U.S. PATENT DOCUMENTS

| | | |
|---|---|---|
| 3,795,805 A | 3/1974 | Swanberg et al. |
| 3,946,438 A | 3/1976 | Altmann et al. |
| 4,777,540 A | 10/1988 | McCoy |
| 5,335,481 A | 8/1994 | Ward |
| 5,861,614 A * | 1/1999 | Gardner ............... 235/379 |
| 5,879,175 A | 3/1999 | Muramatsu et al. |
| 5,912,446 A | 6/1999 | Wong et al. |
| 6,021,948 A | 2/2000 | Tsai et al. |
| 6,186,402 B1 | 2/2001 | Johnson |
| 6,283,376 B1 | 9/2001 | Schuder et al. |
| 6,307,386 B1 | 10/2001 | Fowler et al. |
| 2003/0047607 A1 * | 3/2003 | Swanson et al. ............ 235/454 |

FOREIGN PATENT DOCUMENTS

EP 0491321 6/1992

OTHER PUBLICATIONS

"Banking Card Inserter and Remover for Tester," IBM Technical Disclosure Bulletin, vol. 31, No. 5, Oct. 1988, pp. 474–476.

* cited by examiner

Primary Examiner—Thien M. Le
Assistant Examiner—April Nowlin
(74) Attorney, Agent, or Firm—J. Bruce Schelkopf

(57) ABSTRACT

An automated insertion/retrieval device for card reading device testing includes a housing assembly whose back face is coupled to a shaft of an air cylinder. Coupled to the side faces of the housing assembly are upper and lower gripper roller assemblies. As the test card is expelled from a card reading device, it is gripped by the gripper roller assemblies, activating a microswitch and supplying air to the air cylinder. The shaft retracts and moves the housing assembly away from the card reading device until the test card abuts a stationary card bumper, causing the test card to shift in position toward the card reading device, deactivating the microswitch and turning off the air supply to the air cylinder. An internal return spring of the air cylinder extends the shaft and returns the housing assembly to its original position, reinserting the test card into the card reading device

18 Claims, 5 Drawing Sheets

CREDIT CARD/SMART CARD TEST DEVICE

FIELD OF THE INVENTION

The present invention relates to card reading devices, and more particularly to the testing of card reading devices.

BACKGROUND OF THE INVENTION

Card reading devices, such as credit card or smart card reading devices, are well known in the art. During the product development phase, long term life testing is performed on the card reading devices to determine their reliability. Magnetically encoded and/or smart test cards must be retrieved from and reinsertion into the card reading device under test. To properly test the card reading devices, up to one million retrieval and reinsertion cycles are required. To use human intervention to perform the retrievals and reinsertions is impractical and would necessitate significant human resources.

One conventional approach is to physically mount a test card to the shaft of an air cylinder, place the test card into a card reading device, and extend and contract the shaft to pass the magnetic stripe of the test card by a read head. However, this does not accurately simulate the retrievals and reinsertions of a card by human users and would only apply for slot type card readers.

Accordingly, there exists a need for an automated card insertion/retrieval device for card reading device testing. The device should simulate the retrieval from and insertion of cards to the card reading device by humans. The present invention addresses such a need.

SUMMARY OF THE INVENTION

An automated insertion/retrieval device for card reading device testing includes a housing assembly whose back face is coupled to a shaft of an air cylinder. Coupled to the side faces proximate to the front face of the housing assembly are upper and lower gripper roller assemblies. As the test card is expelled from a card reading device, the test card is gripped by the gripper roller assemblies. At the end of its travel, the test card activates a microswitch and supplies air to the air cylinder. The air cylinder shaft retracts and moves the housing assembly away from the card reading device until the test card abuts a stationary card bumper. The stationary card bumper causes the test card to shift in position back toward the card reading device, deactivating the microswitch and turning off the air supply to the air cylinder. An internal return spring of the air cylinder extends the shaft and returns the housing assembly to its original position, reinserting the test card into the card reading device. The position shift ensures that the card reading device under test will sense the presence of the test card and accept it for the next cycle.

DETAILED DESCRIPTION

The present invention provides an automated card insertion/retrieval device for card reading device testing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 1 through 5 in conjunction with the discussion below.

Figure 1:
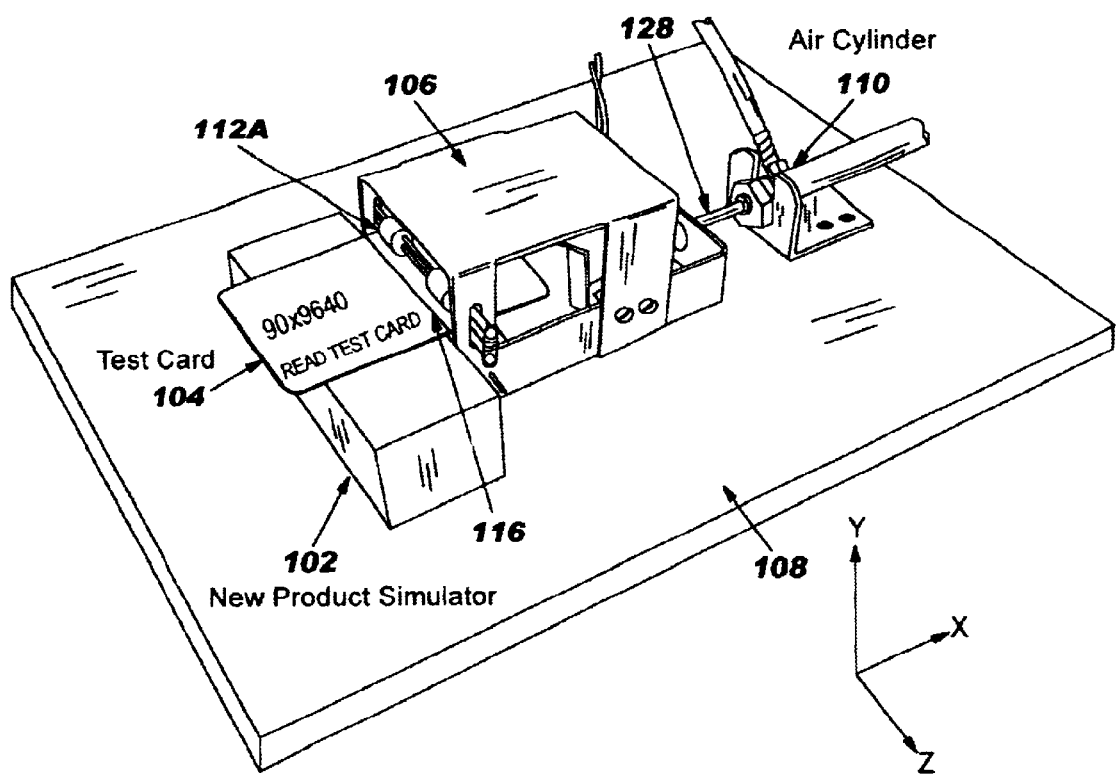
FIG. 1 illustrates a preferred embodiment of an automated card insertion/retrieval device in accordance with the present invention.

FIG. 1 illustrates a preferred embodiment of an automated card insertion/retrieval device in accordance with the present invention. The device comprises a housing or carriage assembly 106 with its back face coupled to a shaft 128 of an air cylinder 110, with the air cylinder 110 mounted onto a base plate 108. The front face of the housing assembly 106 is proximate to a card reading device (not shown), whose height and front edge is simulated by a simulator block 102. In the preferred embodiment, the housing assembly 106 is composed of metal, however, other materials may also be used. Mounted to the housing assembly 106 proximate to its front face is an upper gripper roller assembly 112A and a lower gripper roller assembly 112B (hidden). The axis of the upper gripper roller assembly 112A reside within slots 113 in the side faces of the housing assembly 106, allowing the upper gripper roller assembly 112A to float within the slots 113. The axis of the lower gripper roller assembly 112B is affixed through two holes (hidden) at the side faces of the housing assembly 106. Springs 114 are coupled to the upper and the lower gripper roller assemblies 112A–112B at the end of their axes to provide a pinching action. In the preferred embodiment, the gripper roller assemblies 112A–112B are not otherwise powered.

When the card reading device expels a test card 104, the leading edge of the test card 104 forces the upper and lower gripper roller assemblies 112A–112B apart and continues to drive the test card 104 to its maximum protrusion beyond the front edge of the card reading device. The location on the test card 104 that matches the front edge protrusion of the card reading device is marked by a reference line 116. The action of the leading edge of the test card 104 being forcibly inserted between the upper and lower gripper roller assemblies 112A–112B causes the upper gripper roller assembly 112A to move upward within the slots 113. The tension in the springs 114 coupled to the gripper roller assemblies 112A–112B then pinches or grips the leading edge of the test card 104 as it is expelled.

Figure 2:
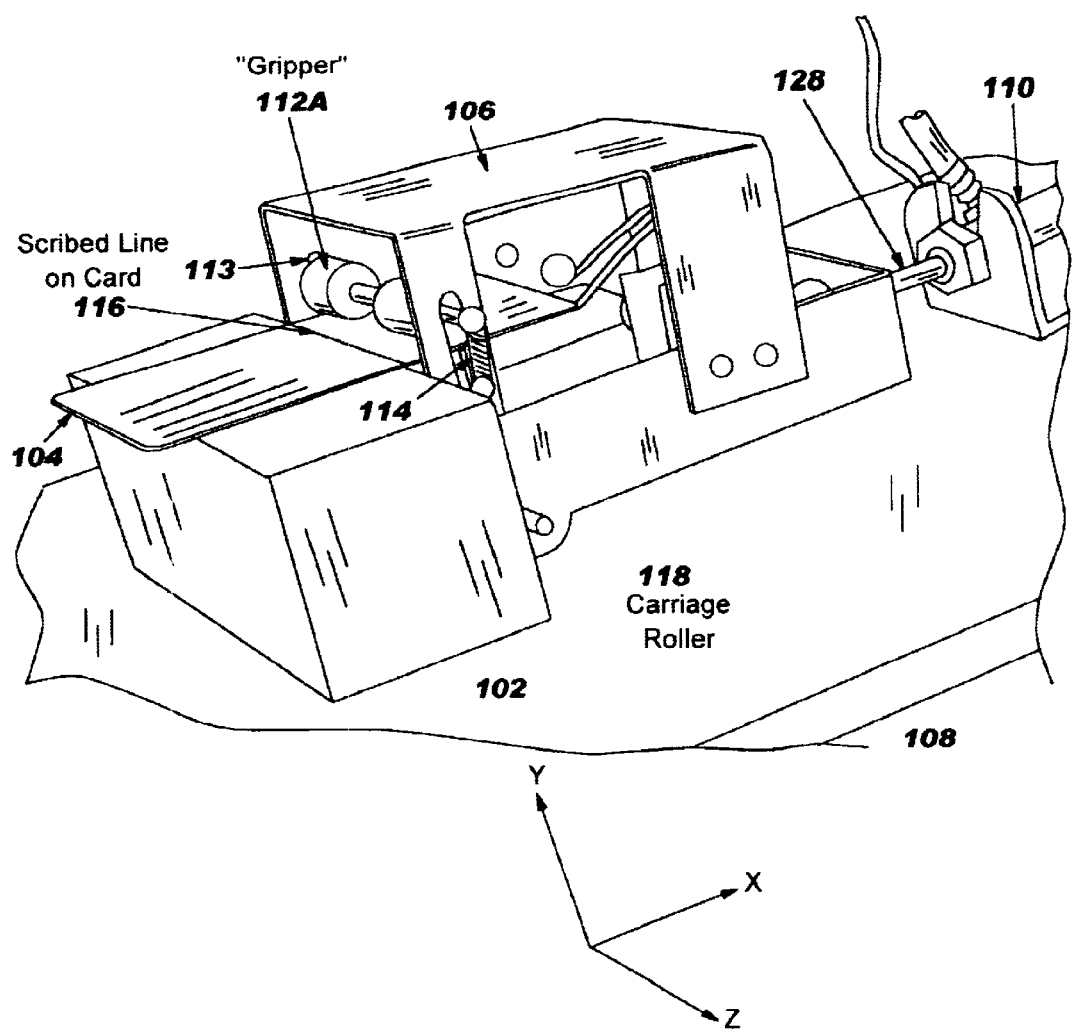
FIG. 2 illustrates a closer view of the preferred embodiment of the automated insertion/retrieval device in accordance with the present invention.

FIG. 2 illustrates a closer view of the preferred embodiment of the automated insertion/retrieval device in accordance with the present invention. As illustrated, a housing assembly roller 118 is also coupled to the housing assembly 106 proximate to the front face of the housing assembly 106 and abuts the base plate 108. The back face of the housing assembly 106 is coupled to the shaft 128 of an air cylinder 110. The air cylinder 110 also comprises an internal return spring (hidden), whose function is described below.

Figure 3:
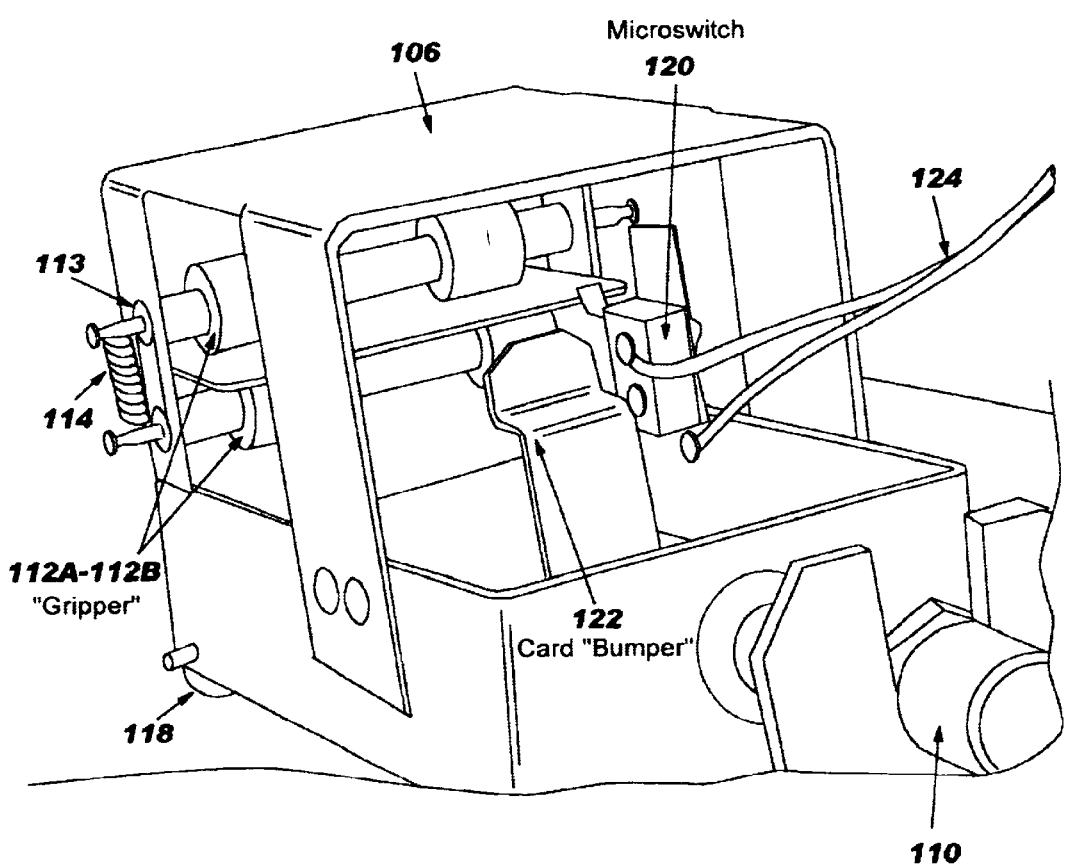
FIG. 3 illustrates an alternative view of the preferred embodiment of the automated insertion/retrieval device in accordance with the present invention.

FIG. 3 illustrates an alternative view of the preferred embodiment of the automated insertion/retrieval device in accordance with the present invention. This view illustrates a microswitch 120 coupled to the housing assembly 106, and a card bumper 122 coupled to the base plate 108 proximate to the back face of the housing assembly 106. When the leading edge of the test card 104 is forcibly inserted between the gripper roller assemblies 112A–112B and travels its fully extended path, the leading edge of the test card 104 engages the microswitch 120, placing it in a first state, i.e., activating it. The pinching of the test card 104 by the gripper roller assemblies 112A–112B holds the leading edge of the test card 104 against the microswitch 120, keeping it active. Through wires 124, the microswitch 120 turns on an air solenoid (not shown), supplying air to the air cylinder 110. As a result, the shaft 128 of the air cylinder 110 begins to contract, causing the housing assembly 106 to move, via the roll of the housing assembly roller 118, away from the card reading device. With the test card 104 gripped between the gripper roller assemblies 112A–112B, the movement of the housing assembly 106 moves the test card 104 away from the card reading device. This simulates the retrieval of the test card 104 by a human user.

The housing assembly 106 will continue moving as long as air is supplied to the air cylinder 110. Eventually, the leading edge of the test card 104 abuts the card bumper 122. Since the card bumper 122 is coupled to the base plate 108 and is thus stationary, abutting against it causes the test card 104 to stop moving. The card bumper 122 is of sufficient width to ensure that the test card 104 will maintain a parallel posture relative to the card reading device's reentry slot. In addition, the test card's position relative to the housing assembly 106 shifts toward the card reading device as the shaft 128 of the air cylinder 110 fully retracts. This shift in position causes the test card 104 to place the microswitch 120 in a second state, i.e., deactivating it.

Figure 4:
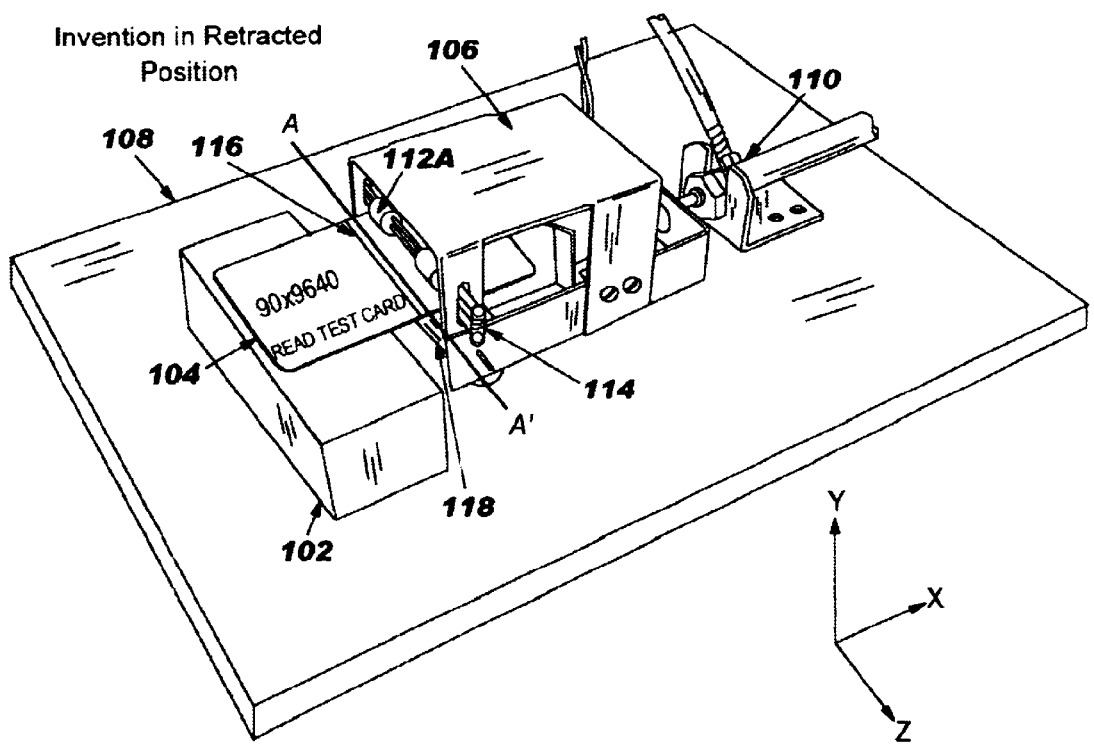
FIG. 4 illustrates the housing assembly 106 of the preferred embodiment of the automated insertion/retrieval device in accordance with the present invention in the fully retracted position.

FIG. 4 illustrates the housing assembly 106 of the preferred embodiment of the automated insertion/retrieval device in accordance with the present invention in the fully retracted position. As illustrated, because the position of the test card 104 has shifted, the location of the test card 104 that will now match the front edge of the card reading device has also shifted and is marked by the reference line 126.

When the shifting of the test card 104 deactivates the microswitch 120, the air supply to the air cylinder 110 is turned off. With the air supply off, the internal return spring (hidden) of the air cylinder 110 extends the shaft 128. This pushes the housing assembly 106 back toward the card reading device, eventually restoring it to its original position.

Figure 5:
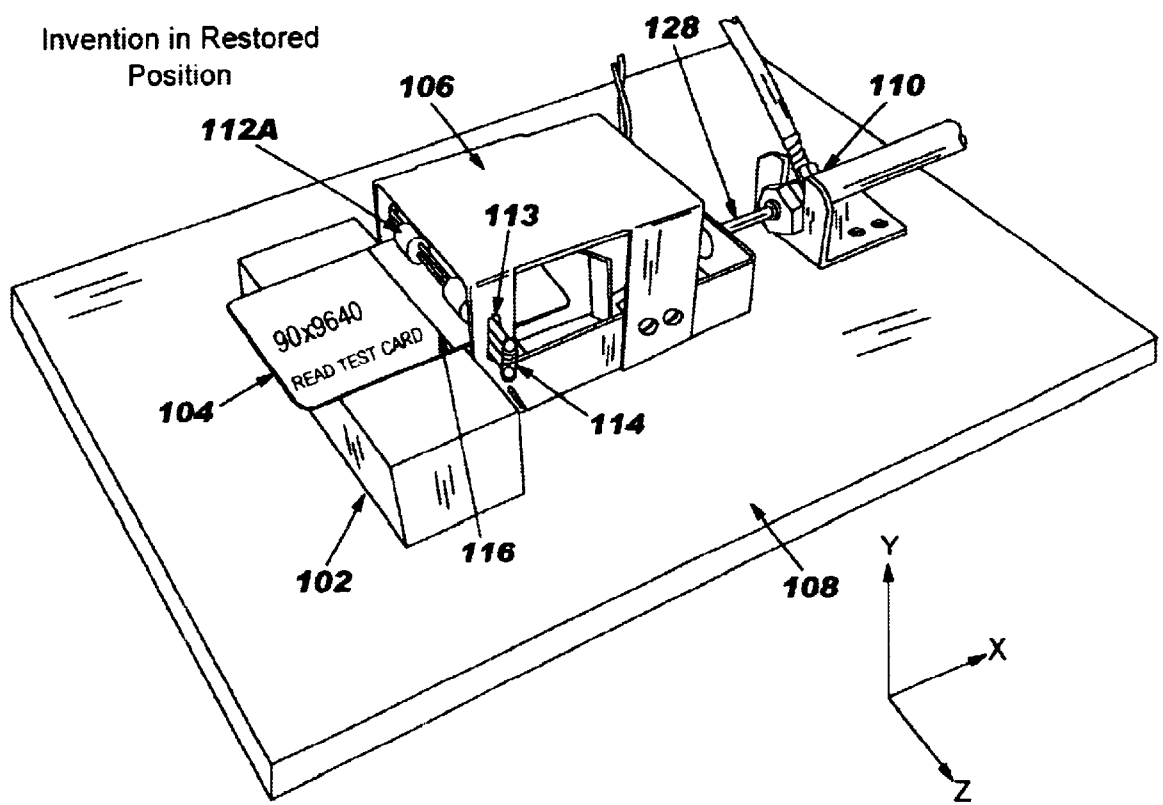
FIG. 5 illustrates the housing assembly 106 of the preferred embodiment of the automated insertion/retrieval device in accordance with the present invention in the fully restored position.

FIG. 5 illustrates the housing assembly 106 of the preferred embodiment of the automated insertion/retrieval device in accordance with the present invention in the fully restored position. As illustrated, because the position of the test card 104 has shifted, when the housing assembly 106 is at its fully restored position, the test card 104 is reinserted into the card reading device a further distance than the test card 104 was expelled. This additional distance is necessary for a sensor within the card reading device to detect the presence of the test card 104. This ensures the activation of the card reading device's own capstan/feed rollers (not shown) and provides a leading edge surface for the test card 104 to be pulled back into the card reading device. This simulates the insertion of the test card 104 by a human user. Once the card reading device again expels the test card 104, the cycle begins again at FIG. 1.

An automated insertion/retrieval device for card reading device testing has been disclosed. The device comprises a housing assembly whose back face is coupled to a shaft of an air cylinder. Coupled to the side faces and proximate to the front face of the housing assembly are upper and lower gripper roller assemblies. As the test card is expelled from a card reading device, the test card is gripped by the gripper roller assemblies. At the end of its travel, the test card activates a microswitch and supplies air to the air cylinder. The air cylinder shaft retracts and moves the housing assembly away from the card reading device until the test card abuts a stationary card bumper. The stationary card bumper causes the test card to shift in position back toward the card reading device, deactivating the microswitch and turning off the air supply to the air cylinder. An internal return spring of the air cylinder extends the shaft and returns the housing assembly to its original position, reinserting the test card into the card reading device. The position shift ensures that the card reading device under test will sense the presence of the test card and accept it for the next cycle. The insertion/retrieval device is automated and simulates the retrieval and reinsertion of the test card by a human user. Because the test card is not permanently coupled to the insertion/retrieval device, this simulation is more accurate than prior art devices. The insertion/retrieval device is also cost efficient to manufacture. No electronic control circuitry, microprocessors, Programmable Logic Arrays, or direct connections to the card reading device under test are required. Instead, the automated insertion/retrieval device responds only to the presentation of the test card by the card reading device.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An automated card retrieval and reinsertion device for card reading device testing, comprising:

a housing assembly comprising a front face proximate to the card reading device;

a shaft coupled to a back face of the housing assembly;

a set of roller assemblies coupled to side faces of the housing assembly proximate to the front face for gripping a test card;

a microswitch coupled to the housing assembly, wherein the shaft moves the housing assembly away from the card reading device when the microswitch is in a first state, wherein the shaft moves the housing assembly toward the card reading device when the microswitch is in a second state, wherein the microswitch is placed into the first state by the test card when the test card is retrieved from the card reading device; and a stationary card bumper proximate to the back face of the housing assembly, wherein a position of the test card is shifted toward the card reading device when the test card abuts the stationary card bumper, wherein the shifting of the test card places the microswitch in the second state.

2. The device of claim 1, further comprising an air cylinder, comprising:
   the shaft, wherein the shaft retracts when an air supply is provided to the air cylinder, wherein the air supply is provided when the microswitch is in the first state; and
   an internal return spring, wherein the internal return spring extends the shaft when the air supply is not provided to the air cylinder, wherein the air supply is not provided when the microswitch is in the second state.

3. The device of claim 1, wherein the set of roller assemblies comprises:
   an upper gripper roller assembly, wherein an axis of the upper gripper roller assembly resides within a plurality of slots in the side faces of the housing assembly;
   a lower gripper roller assembly, wherein an axis of the lower gripper roller assembly is fixedly coupled to the side faces of the housing assembly; and
   a plurality of springs coupled to the axes of the upper and lower gripper roller assemblies.

4. The device of claim 1, wherein the stationary card bumper is fixedly coupled to a base plate.

5. The device of claim 1, wherein the stationary card bumper is of sufficient width to ensure that the test card will maintain a parallel posture relative to a reentry slot of the card reading device.

6. The device of claim 1, further comprising a housing assembly roller coupled the side faces of the housing assembly proximate to the front face and abutting a base plate.

7. The device of claim 1, wherein the shift of the position of the test card allows the test card to be reinserted into the card reading device, such that the card reading device is able to detect a presence of the test card.

8. An automated card retrieval and reinsertion device for card reading device testing, comprising:
   a housing assembly comprising a front face proximate to the card reading device;
   a shaft coupled to a back face of the housing assembly;
   an upper gripper roller assembly, wherein an axis of the upper gripper roller assembly resides within a plurality of slots in side faces of the housing assembly;
   a lower gripper roller assembly, wherein an axis of the lower gripper roller assembly is fixedly coupled to the side faces of the housing assembly, wherein the upper and lower gripper roller assemblies grip a test card;
   a plurality of springs coupled to the axes of the upper and lower gripper roller assemblies;
   a microswitch coupled to the housing assembly, wherein the shaft moves the housing assembly away from the card reading device when the microswitch is in a first state, wherein the shaft moves the housing assembly toward the card reading device when the microswitch is in a second state, wherein the microswitch is placed into the first state by the test card when the test card is retrieved from the card reading device; and
   a stationary card bumper proximate to the back face of the housing assembly, wherein a position of the test card is shifted toward the card reading device when the test card abuts the stationary card bumper, wherein the shifting of the test card places the microswitch in the second state.

9. The device of claim 8, further comprising an air cylinder, comprising:
   the shaft, wherein the shaft retracts when an air supply is provided to the air cylinder, wherein the air supply is provided when the microswitch is in the first state; and
   an internal return spring, wherein the internal return spring extends the shaft when the air supply is not provided to the air cylinder, wherein the air supply is not provided when the microswitch is in the second state.

10. The device of claim 8, wherein the stationary card bumper is fixedly coupled to a base plate.

11. The device of claim 8, wherein the stationary card bumper is of sufficient width to ensure that the test card will maintain a parallel posture relative to a reentry slot of the card reading device.

12. The device of claim 8, further comprising a housing assembly roller coupled the side faces of the housing assembly proximate to the front face and abutting a base plate.

13. The device of claim 8, wherein the shift of the position of the test card allows the test card to be reinserted into the card reading device, such that the card reading device is able to detect a presence of the test card.

14. An automated card retrieval and reinsertion device for card reading device testing, comprising:
   a housing assembly comprising a front face proximate to the card reading device;
   an air cylinder, comprising:
      a shaft coupled to a back face of the housing assembly, wherein the shaft retracts when an air supply is provided to the air cylinder, and
      an internal return spring, wherein the internal return spring extends the shaft when the air supply is not provided to the air cylinder;
   an upper gripper roller assembly, wherein an axis of the upper gripper roller assembly resides within a plurality of slots in side faces of the housing assembly;
   a lower gripper roller assembly, wherein an axis of the lower gripper roller assembly is fixedly coupled to the side faces of the housing assembly, wherein the upper and lower gripper roller assemblies grip a test card;
   a plurality of springs coupled to the axes of the upper and lower gripper roller assemblies;
   a microswitch coupled to the housing assembly, wherein the air supply is provided to the air cylinder when the microswitch is in a first state, wherein the air supply is not provided to the air cylinder when the microswitch is in a second state, wherein the microswitch is placed into the first state by the test card when the test card is retrieved from the card reading device; and
   a stationary card bumper proximate to the back face of the housing assembly, wherein a position of the test card is shifted toward the card reading device when the test card abuts the stationary card bumper, wherein the shifting of the test card places the microswitch in the second state.

15. The device of claim 14, wherein the stationary card bumper is fixedly coupled to a base plate.

16. The device of claim 14, wherein the stationary card bumper is of sufficient width to ensure that the test card will maintain a parallel posture relative to a reentry slot of the card reading device.

17. The device of claim 14, further comprising a housing assembly roller coupled the side faces of the housing assembly proximate to the front face and abutting a base plate.

18. The device of claim 14, wherein the shift of the position of the test card allows the test card to be reinserted into the card reading device, such that the card reading device is able to detect a presence of the test card.

* * * * *